US009980395B2

(12) United States Patent
Shimazawa et al.

(10) Patent No.: US 9,980,395 B2
(45) Date of Patent: May 22, 2018

(54) METHOD OF MANUFACTURING LASER DIODE UNIT UTILIZING SUBMOUNT BAR

(71) Applicants: TDK Corporation, Tokyo (JP); ROHM CO., LTD., Kyoto-shi, Kyoto (JP); SAE Magnetics (H.K.) Ltd., Hong Kong (CN)

(72) Inventors: Koji Shimazawa, Tokyo (JP); Osamu Shindo, Tokyo (JP); Yoshihiro Tsuchiya, Tokyo (JP); Yasuhiro Ito, Tokyo (JP); Kenji Sakai, Kyoto (JP)

(73) Assignees: TDK Corporation, Tokyo (JP); ROHM CO., LTD., Kyoto (JP); SAE Magnetics (H.K.) Ltd., Hong Kong (CN)

( * ) Notice: Subject to any disclaimer, the term of this patent is extended or adjusted under 35 U.S.C. 154(b) by 239 days.

(21) Appl. No.: 14/492,244

(22) Filed: Sep. 22, 2014

(65) Prior Publication Data

US 2015/0040390 A1    Feb. 12, 2015

Related U.S. Application Data

(62) Division of application No. 13/445,054, filed on Apr. 12, 2012, now Pat. No. 8,866,041.

(51) Int. Cl.
*B23K 26/00* (2014.01)
*H01S 5/00* (2006.01)
(Continued)

(52) U.S. Cl.
CPC ......... *H05K 3/3421* (2013.01); *B23K 1/0016* (2013.01); *H01S 5/02236* (2013.01); *H01S 5/02272* (2013.01); *Y10T 29/49144* (2015.01)

(58) Field of Classification Search
CPC ....... G11B 5/127; G11B 5/3109; G11B 5/313; G11B 5/3133; G11B 5/3136; G11B 5/314;
(Continued)

(56) References Cited

U.S. PATENT DOCUMENTS 4,404,453 A    9/1983  Gotman
4,616,121 A   10/1986  Clocksin et al.
(Continued)

OTHER PUBLICATIONS

Office Action dated Nov. 26, 2015 issued in corresponding CN patent application No. 201310045946.5 (English translation only).
(Continued)

*Primary Examiner* — David Angwin
*Assistant Examiner* — Gyounghyun Bae
(74) *Attorney, Agent, or Firm* — Posz Law Group, PLC (57) ABSTRACT

A manufacturing method of laser diode unit of the present invention includes steps: placing a laser diode on top of a solder member formed on a mounting surface of a submount, applying a pressing load to the laser diode and pressing the laser diode against the solder member, next, melting the solder member by heating the solder member at a temperature higher than a melting point of the solder member while the pressing load is being applied, and thereafter, bonding the laser diode to the submount by cooling and solidifying the solder member, thereafter, removing the pressing load, and softening the solidified solder member by heating the solder member at a temperature lower than the melting point of the solder member after the pressing load has been removed, and thereafter cooling and re-solidifying the solder member.

4 Claims, 7 Drawing Sheets

(51) Int. Cl.
*H05K 3/34* (2006.01)
*B23K 1/00* (2006.01)
*H01S 5/022* (2006.01)

(58) Field of Classification Search
CPC ..... G11B 5/3143; G11B 5/3146; G11B 5/315;
G11B 5/3153; G11B 5/3156; G11B
5/3159; G11B 5/3163; G11B 5/33; G11B
5/332; G11B 5/335; G11B 5/35; G11B
5/37; G11B 5/372; G11B 5/374; G11B
5/376; G11B 5/378; G11B 5/39; G11B
5/3903; G11B 5/3906; G11B 5/3909;
G11B 5/3912; G11B 5/3916; G11B
5/3919; G11B 5/3922; G11B 5/3925;
G11B 5/2929; G11B 5/3932; G11B
5/3935; G11B 5/3938; G11B 5/3941;
G11B 5/3945; G11B 5/3948; G11B
5/3951; G11B 5/3954; G11B 5/3958;
G11B 5/3961
USPC ....... 29/829, 846, 603.07, 760, 743; 360/59;
369/13.02, 13.14
See application file for complete search history.

(56) References Cited

U.S. PATENT DOCUMENTS

| | | | | |
|---|---|---|---|---|
| 5,099,488 | A * | 3/1992 | Ahrabi | H01S 5/4025 372/36 |
| 5,321,259 | A | 6/1994 | Morgan | |
| 5,469,459 | A | 11/1995 | Okuda et al. | |
| 5,481,082 | A | 1/1996 | Yamamoto | |
| 5,481,084 | A | 1/1996 | Patrick et al. | |
| 5,521,931 | A * | 5/1996 | Biegelsen | H01S 5/02252 372/36 |
| 5,866,440 | A | 2/1999 | Hata | |
| 5,903,583 | A | 5/1999 | Ullman et al. | |
| 5,923,692 | A * | 7/1999 | Staskus | H01S 5/4025 372/34 |
| 6,396,857 | B1 | 5/2002 | Labranche et al. | |
| 6,445,722 | B2 | 9/2002 | Hamamoto | |
| 6,603,093 | B2 | 8/2003 | Epitaux et al. | |
| 6,998,587 | B2 | 2/2006 | Kirkpatrick et al. | |
| 7,223,617 | B2 * | 5/2007 | Mochida | H01S 5/02272 257/E33.056 |
| 7,784,670 | B2 | 8/2010 | Suga et al. | |
| 8,036,508 | B2 | 10/2011 | Bhagavatula et al. | |
| 8,207,608 | B2 | 6/2012 | Chew et al. | |
| 2002/0172244 | A1 * | 11/2002 | Li | H01S 5/0201 372/36 |
| 2003/0048819 | A1 * | 3/2003 | Nagano | G02B 6/4206 372/36 |
| 2004/0027631 | A1 * | 2/2004 | Nagano | G02B 6/4206 372/36 |
| 2005/0035184 | A1 * | 2/2005 | Mano | B23K 1/0056 228/248.1 |
| 2005/0041934 | A1 * | 2/2005 | Zama | G02B 6/4201 385/92 |
| 2005/0067636 | A1 * | 3/2005 | Amoh | H01S 5/02272 257/232 |
| 2005/0069266 | A1 * | 3/2005 | Kouta | H01S 5/02264 385/92 |
| 2005/0141579 | A1 * | 6/2005 | Yamane | H01S 5/0425 372/46.01 |
| 2007/0208117 | A1 | 9/2007 | Matsuki et al. | |
| 2007/0287210 | A1 * | 12/2007 | Kihara | H01S 5/024 438/26 |
| 2008/0043360 | A1 * | 2/2008 | Shimazawa | G11B 5/02 360/59 |
| 2008/0056073 | A1 * | 3/2008 | Shimizu | G11B 5/314 369/13.02 |
| 2009/0008773 | A1 * | 1/2009 | Wong | H01L 21/50 257/720 |
| 2009/0129420 | A1 * | 5/2009 | Regaard | H01S 5/4012 372/50.12 |
| 2009/0188891 | A1 * | 7/2009 | Tanaka | G11B 5/314 216/22 |
| 2010/0085846 | A1 | 4/2010 | Shimazawa et al. | |
| 2011/0051758 | A1 * | 3/2011 | Krejci | H01S 5/02272 372/34 |
| 2011/0128827 | A1 * | 6/2011 | Shimazawa | G11B 5/314 369/13.02 |
| 2011/0141862 | A1 * | 6/2011 | Arai | G11B 5/314 369/13.33 |
| 2011/0182309 | A1 * | 7/2011 | Deri | H01S 5/02469 372/36 |
| 2011/0235669 | A1 * | 9/2011 | Deri | H01S 5/02252 372/50.12 |
| 2011/0242697 | A1 * | 10/2011 | Mori | G11B 5/314 360/59 |
| 2011/0266469 | A1 * | 11/2011 | Goulakov | G11B 5/105 250/505.1 |
| 2011/0286484 | A1 * | 11/2011 | Raring | B82Y 20/00 372/44.011 |
| 2012/0073120 | A1 * | 3/2012 | Shimazawa | G11B 5/105 29/603.07 |
| 2012/0147717 | A1 * | 6/2012 | Shimazawa | G11B 5/314 369/13.33 |
| 2012/0163138 | A1 * | 6/2012 | Gage | G11B 5/314 369/13.11 |
| 2013/0127041 | A1 * | 5/2013 | Goh | B23K 1/0016 257/737 |
| 2013/0143338 | A1 * | 6/2013 | Stephens, IV | H01S 5/405 438/27 |

OTHER PUBLICATIONS

Chinese Office Action dated Jun. 27, 2016 in the corresponding CN application No. 201310045946.5(English translation attached).

* cited by examiner

METHOD OF MANUFACTURING LASER DIODE UNIT UTILIZING SUBMOUNT BAR

CROSS REFERENCE TO RELATED APPLICATION

The present application is a divisional application of U.S. application Ser. No. 13/445,054 filed on Apr. 12, 2012.

BACKGROUND OF THE INVENTION

Field of the Invention

The present invention relates an apparatus and a method of manufacturing a laser diode unit. In particular, the present invention relates to an apparatus and a method for mounting a laser diode on a submount.

Description of the Related Art

Along with the advancement of high recording density of the hard disk drive (HDD), further improvement is demanded in the performance of a thin film magnetic head. As the thin film magnetic head, a composite type thin film magnetic head is widely used having a structure in which a reproducing head having a magnetoresistive effect element (MR element) for reading and a recording head having an induction-type electromagnetic transducer element for writing are laminated.

A magnetic recording medium used in magnetic recording is made of a discontinuous medium composed of magnetic nanoparticles, and each of the magnetic nanoparticles has a single magnetic domain structure. A recording region (each one bit) is formed by a plurality of the magnetic nanoparticles. Therefore, the boundary of the recording region has an uneven shape. In order to increase the recording density, it is necessary to decrease the unevenness at the boundaries of the recording regions. To that end, it is effective to reduce the size of the magnetic nanoparticles. However, when the magnetic nanoparticles are decreased in size, thermal stability deteriorates due to decrease in volume of the magnetic nanoparticles. In order to enhance the thermal stability, it is preferable that a magnetic material having a large magnetic anisotropy constant $K_U$ be used. However, an increase in the anisotropy energy of the magnetic nanoparticles will lead to an increase in the coercive force of the magnetic recording medium so that recording of information using a conventional magnetic head becomes difficult. For this reason, a method is proposed in which, during recording, heat is also applied at the same time when a magnetic field is applied, to lower the coercive force to perform recording. Such a method is referred to as thermally assisted magnetic recording.

In the thermally assisted magnetic recording technology, generating a fine light spot is important, but where and how to provide a light source (laser diode unit) is also a very important problem. In the specification of U.S. Patent Application Publication No. 2008/0043360, a head structure is disclosed in which a laser diode unit having a laser diode mounted therein is mounted on a back surface (back surface of an air bearing surface) of a magnetic head slider on which a recording head and a reproducing head are mounted. This structure is referred to as a composite magnetic head slider structure.

The composite magnetic head slider structure has, in principle, a merit that both the laser diode and the magnetic head slider can be individually assessed in characterization. In a case where the laser diode and the magnetic head slider are prepared on a single wafer in a wafer process, when a defect is found in any one of the laser diode and the magnetic head slider, the magnetic head has to be defective, so that it is possible that the yield of the magnetic head degrades as compared to a conventional magnetic head having only a magnetic head slider. In contrast, in the composite magnetic head slider structure, the laser diode can be independently tested before the laser diode is mounted on the magnetic head slider. Therefore, a defective laser diode can be eliminated in advance, and only a non-defective laser diode is mounted on a magnetic head slider. Therefore, a yield comparable to that of the conventional magnetic head can be ensured.

A laser diode unit can in general be manufactured by the following steps.

(1) A base substrate (submount) is prepared having a mounting surface on which a laser diode is to be mounted. A solder member such as AuSn or the like is formed on the mounting surface. Next, the laser diode is placed on the solder member in such a manner that a metal film such as Au or the like forming an electrode of the laser diode is in contact with the solder member. Thereafter, a pressing load of from several grams to several tens of grams is applied to the laser diode by using a nozzle (which is also referred to as a collet) to press the laser diode against the solder member.

(2) The submount is heated to melt the solder member on the submount.

(3) In order to allow the molten solder member to fuse with the metal film, the heating state is maintained for a certain period of time. Thereafter, the temperature is lowered.

(4) The nozzle is taken away from the laser diode and the pressing load is released.

A problem of the case where such a common manufacturing method is adopted is that a residual stress is generated in the solder member and the laser diode in the steps from (3) to (4). That is, a stress applied to the solder member and the laser diode by the pressing load of the nozzle remains in the solder member and the laser diode in the cooling and solidifying process of the solder member. A HDD, with which a thermally-assisted head may be used, requires a mean time to failure (MTTF) that is one order of magnitude or more greater than an optical disk drive such as a DVD. Therefore, when a conventional process that has been used for such a DVD or the like is applied to a laser diode for the thermally-assisted head, the subtle stress state becomes a problem.

The residual stress can be released, after the completion of the step (4), by re-melting the solder member in a state in which the pressing load is not applied. This is because the pressing load is not applied so that the solder member itself deforms in the process from re-melting to re-solidifying and the residual stress of solder member is relaxed. However, due to the deformation of the solder member, it is possible that the laser diode that was fixed by the solder member moves relative to the submount. When the laser diode unit, a laser light emitting portion thereof in particular, moves away from an end portion of a waveguide of the magnetic head slider, the laser light cannot be efficiently incident into the waveguide.

A purpose of the present invention is to provide an apparatus and a method of manufacturing a laser diode unit that can reduce the residual stress generated in the solder member and the laser diode when the laser diode is bonded to the submount, and can mount the laser diode on the submount with high positional accuracy.

SUMMARY OF THE INVENTION

In a manufacturing apparatus of laser diode units of the present invention, each of the laser diode units includes a submount, and a laser diode mounted on the submount, and the manufacturing apparatus includes a holding stage that holds a submount bar in which a plurality of the submounts are arrayed in a row and are physically integrated and on which a plurality of solder members are arrayed in a row, a plurality of the laser diodes being respectively mounted on the plurality of the submounts, the plurality of the laser diodes including a first laser diode and a second laser diode, the plurality of the solder members including a first solder member corresponding to the first laser diode and a second solder member corresponding to the second laser diode and adjacent to the first solder member, a load application device that applies a pressing load to one of the laser diodes placed on the solder member and that presses the one of the laser diodes against the solder member in a state in which the submount bar is held by the holding stage, a heating device that locally heats the solder member in the state in which the submount bar is held by the holding stage, and a controller that controls the heating device and the load application device in a manner that the first solder member is locally heated and melted with the heating device while the load application device applies the pressing load to the first laser diode, and thereafter, the first solder member is heated and softened as the second solder member, which has not yet bonded the second laser diode to the submount bar, is locally heated and melted with the heating device while the load application device applies the pressing load to the second laser diode.

The first solder member is locally heated and melted with the heating device, and bonds the first laser diode to the submount bar. Thereafter, in the same manner, the second solder member is locally heated and melted with the heating device, and bonds the second laser diode to the submount bar. At this point, heat that locally heats the second solder member conducts through the submount bar and propagates to the first solder member, and heats the first solder member. However, because an amount of heat propagating to the first solder member is less than an amount of heat propagating to the second solder member, the first solder member is not melted (that is, the temperature of the first solder member does not reach a melting point thereof), and is only softened. The softened state is a state where slight fluidity is given while a solid state is being maintained, and therefore, without giving a significant effect to the bonding state of the first laser diode, a residual stress of the first solder member is effectively reduced. As a result, restraint force generated not only in the first solder member but also in the first laser diode is released, and the residual stress remaining in the first laser diode is effectively reduced. Deformation of the first solder member can also be suppressed to the minimum, and thereby the laser diode can be mounted on the submount with high positional accuracy.

A manufacturing method of laser diode unit of the invention, in which the laser diode unit includes a submount and a laser diode mounted on the submount, includes a first step placing the laser diode on top of a solder member formed on a mounting surface of the submount, a second step applying a pressing load to the laser diode and pressing the laser diode against the solder member; a third step melting the solder member by heating the solder member at a temperature higher than a melting point of the solder member while the pressing load is being applied, and thereafter, bonding the laser diode to the submount by cooling and solidifying the solder member, and thereafter, removing the pressing load; and a fourth step softening the solidified solder member by heating the solder member at a temperature lower than the melting point of the solder member after the pressing load has been removed, and thereafter cooling and re-solidifying the solder member.

The above and other objects, features and advantages will be disclosed detailed descriptions below referring to the attached figures in which the invention is exemplarily illustrated.

DETAILED DESCRIPTION OF THE INVENTION

Figure 1:
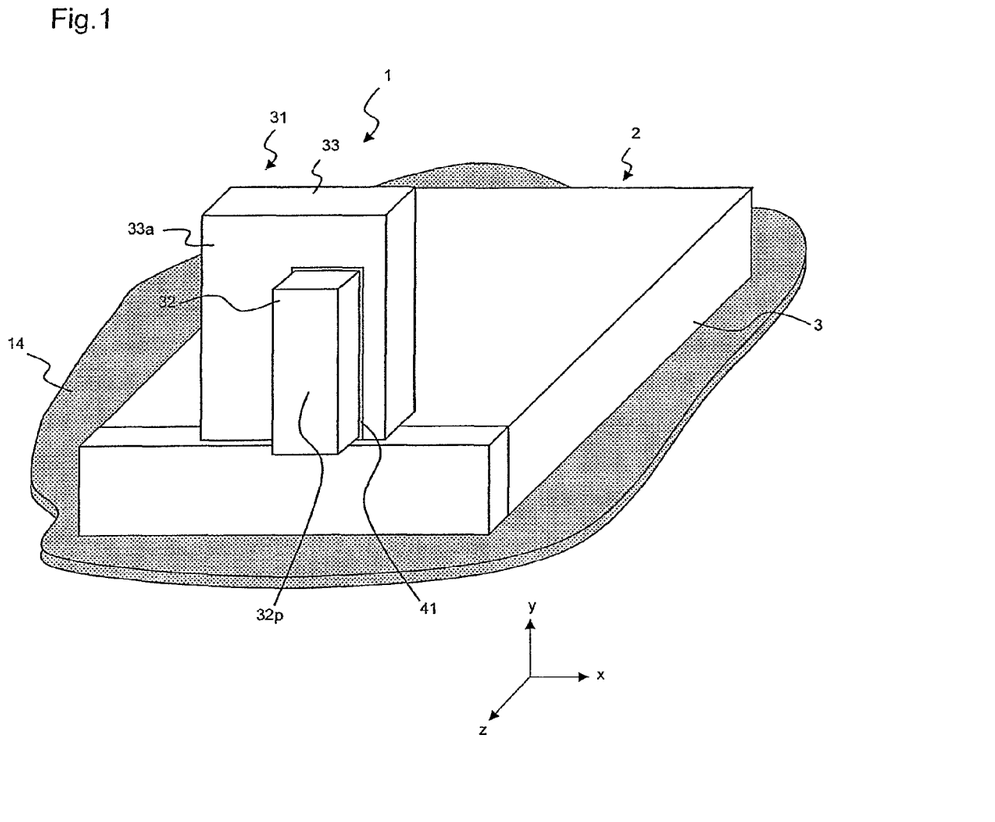
FIG. 1 is a conceptual perspective view of a magnetic head to which the present invention is applied.
Figure 2:
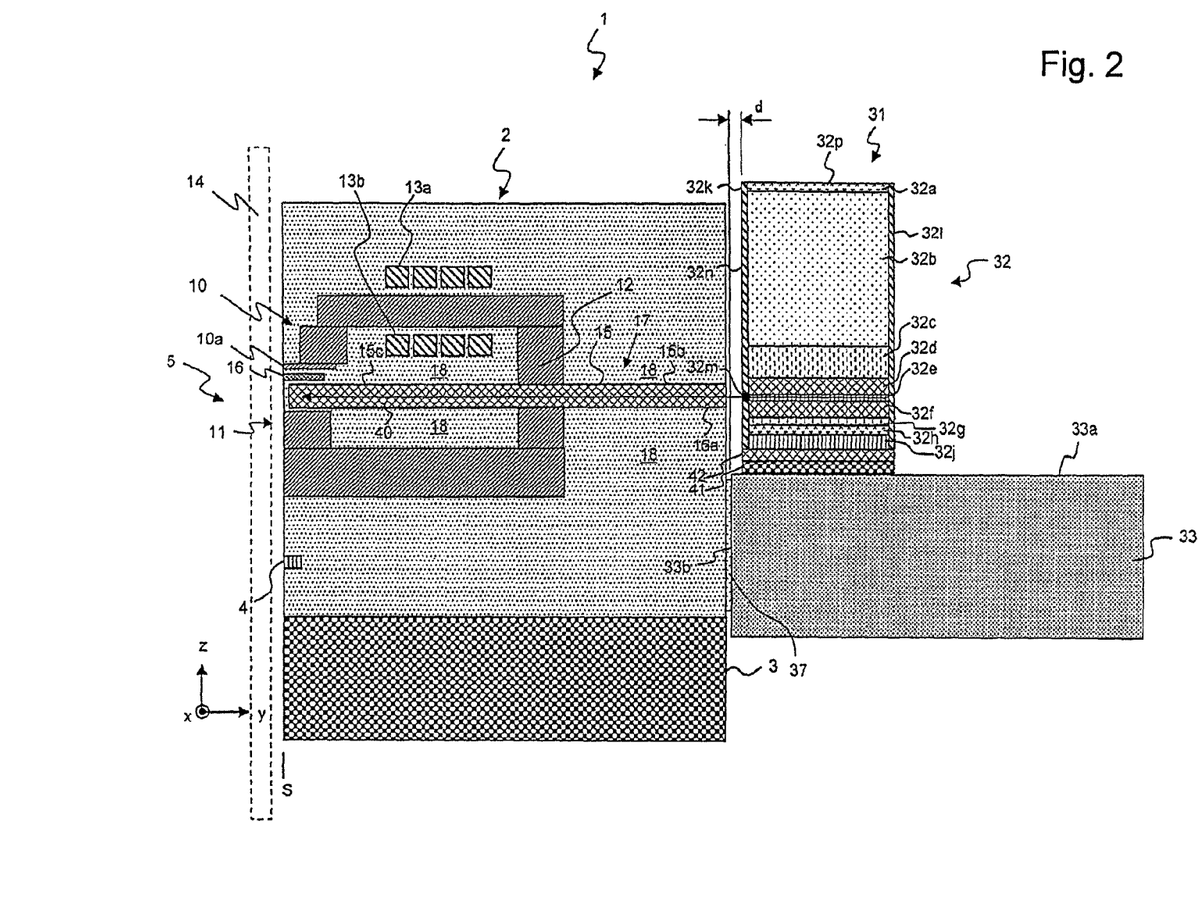
FIG. 2 is a main part cross-sectional view of the magnetic head illustrated in FIG. 1.

First, a configuration of a magnetic head is explained, which is a representative example to which the present invention is applied. FIG. 1 is an overall perspective view of the magnetic head according to an embodiment of the present invention. FIG. 2 is a main part cross-sectional view of the magnetic head.

A magnetic head 1 includes a magnetic head slider 2 and a laser diode unit 31 that is fixed on the magnetic head slider 2 and emits laser light.

The magnetic head slider 2 has a substantially hexahedral shape, one surface of which forms an air bearing surface S that faces a magnetic recording medium 14. The magnetic head slider 2 includes an MR element 4 that forms a reproducing head part, a magnetic recording element 5 that forms a recording head part, a waveguide 17 capable of propagating laser light emitted from the laser diode unit 31 as propagation light, and a plasmon generator 16 that generates near-field light from the propagation light at the air bearing surface S. These components are formed above a substrate 3.

The magnetic recording element 5 has a recording magnetic pole 10 for perpendicular magnetic recording. The recording magnetic pole 10 is provided adjacent to the plasmon generator 16. A magnetic pole tip part 10a, which is an end portion of the recording magnetic pole 10, is positioned at the air bearing surface S, and generates a recording magnetic field at the air bearing surface S. In the vicinity of the recording magnetic pole 10, a return shield layer 11 is provided. In the neighborhood of the recording magnetic pole 10, coils 13a and 13b are wound around a contact part 12. A magnetic flux generated inside the recording magnetic pole 10 is emitted as a magnetic flux for writing from the magnetic pole tip part 10a toward the magnetic recording medium 14. The magnetic flux emitted from the magnetic pole tip part 10a enters the magnetic recording medium 14 and magnetizes each recording hit in a perpendicular direction y. The magnetic flux changes a magnetic path thereof to an in-plane direction (z-direction) of the magnetic recording medium 14, and further changes orientation again to the perpendicular direction (y-direction) in the vicinity of a return shield layer 11 and is absorbed by the return shield layer 11.

The waveguide 17 is provided with a core 15 capable of propagating the laser light generated at the laser diode unit 31 as propagation light 40 and a cladding 18 covering the core 15 and having a refractive index smaller than that of the core 15. The plasmon generator 16 couples in a surface plasmon mode with the propagation light 40 propagating through the core 15 to generate surface plasmons, and propagates the generated surface plasmons to an end portion of the plasmon generator 16 to generate the near-field light at the air bearing surface S.

The laser diode unit 31 is positioned on a surface on the opposite side of the air bearing surface S of the magnetic head slider 2. The laser diode unit 31 emits laser light toward the core 15 of the magnetic head slider 2 in a direction perpendicular to the air bearing surface S. The laser diode unit 31 is soldered to the magnetic head slider 2 by an adhesion layer 37.

The laser diode unit 31 is provided with a laser diode 32 and a submount 33 mounting the laser diode 32. The submount 33 is composed of a Si substrate. The laser diode 32 is mounted on a mounting surface 33a of the submount 33. Specifically, a first electrode (p-electrode) 32j of the laser diode 32 is fixed by a solder member 42 on a pad 41 provided on the mounting surface 33a of the submount 33. The solder member 42 can be formed of AuSn.

The laser diode 32 is a laser diode of an edge emitting type, and InP-based, GaAs-based and GaN-based laser diodes that are commonly used for such applications as communications, optical disc storage and material analysis can be used. The wavelength of the laser light radiated is not particularly limited. However, wavelengths in the range of 375 nm to 1.7 μm can be used. In particular, a wavelength of about 650 nm is favorably used.

Although not limited to the following configuration, in one example, the laser diode 32 has a configuration in which an n-electrode 32a that composes a second electrode, an n-GaAs substrate 32b, an n-InGaAlP cladding layer 32c, a first InGaAlP guide layer 32d, an active layer 32e that is composed of a multiple quantum well (InGaP/InGaAlP) and the like, a second InGaAlP guide layer 32f, a p-InGaAlP cladding layer 32g, a p-electrode base layer 32h, and a p-electrode 32j that composes a first electrode are sequentially laminated. On front and rear cleavage planes of the laser diode 32, reflection layers 32k and 32l are formed for exciting oscillation due to total reflection. On a surface of the reflection layer 32k, that is, on a surface of the laser diode 32 that faces the magnetic head slider 2, a light emission surface 32n of the laser diode 32 is configured. A light emission center 32m exists on the reflection layer 32k at the position of the active layer 32e. The n-electrode 32a and the p-electrode 32j can be formed with Au or Au alloy having a thickness of about 0.1 μm. During the operation of the hard disk drive, power feeding is performed from a power source inside the hard disk drive to the laser diode 32 via the first electrode 32j and the second electrode 32a.

Next, a manufacturing method of the above explained laser diode unit, in particular, a method of mounting the laser diode 32 on the submount 33, and an apparatus used in this method are explained.

FIGS. 3A-3H are conceptual views illustrating steps of mounting a laser diode on a submount.

Figure 3A:
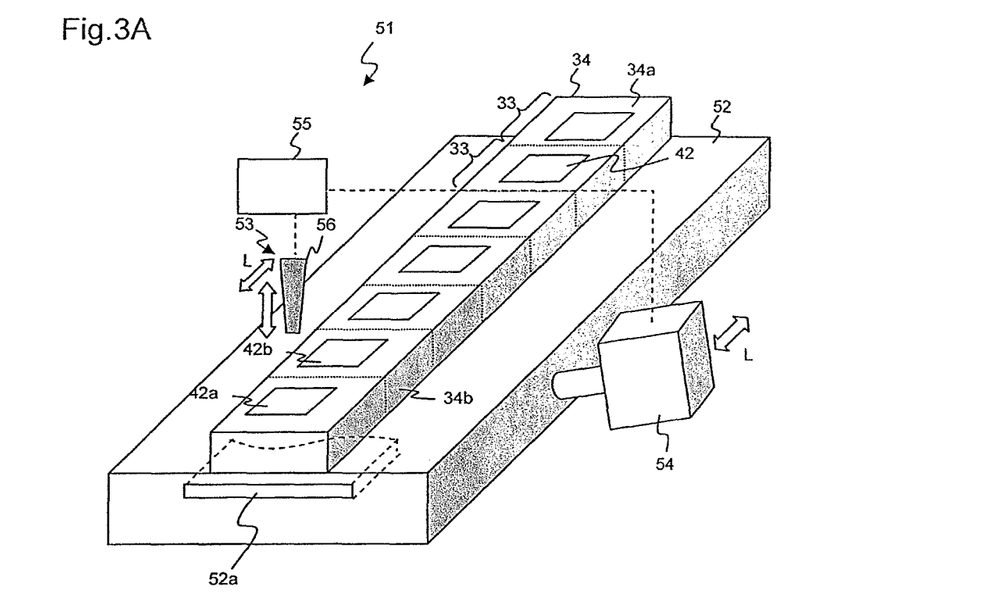
FIGS. 3A-3H are conceptual views illustrating steps of mounting a laser diode on a submount.

With reference to FIG. 3A, a manufacturing apparatus 51 of the laser diode unit includes a holding stage 52 that holds a submount bar 34, a load application device 53 that presses the laser diode 32 against the solder member 42, and a heating device 54 that locally heats the solder member 42. Positions and operations of the load application device 53 and the heating device 54 are controlled by their controller 55.

In the present embodiment, the laser diodes 32 are mounted on and bonded to the submount bar 34, in which the submounts 33 are arrayed in a row and are physically integrated. The number of submounts 33 contained in the submount bar 34 is not particularly limited. In a case where the submount bar 34 has a length of about 80 mm, which is a common value for a manufacturing process of the magnetic head, one submount bar 34 can contain about 100-200 submounts 33.

It is desirable that the holding stage 52 have a preheating device 52a integrated therein for preheating the solder member 42. As will be described later, each laser diode 32 is individually locally heated. However, by heating the entire submount bar 34 in advance, when local heating is performed, the thermal energy for melting the solder member 42 can be cut down. The preheating device 52a can adopt an electrical heater and any other arbitrary configuration. It is preferable that the temperature of the solder member 42 in preheating be lower than a softening temperature to be described later.

As the heating device 54 for local heating, a laser light heating device is used in the present embodiment. The laser light heating device 54 is movable in a longitudinal direction L of the submount bar 34 and can sequentially locally heat each of the submounts 33 contained in the submount bar 34. The irradiation position of the laser light is not limited as long as the solder member 42 can be melt. However, in order to avoid an effect on the laser diode 32, it is desirable that a lateral face 34b of the submount bar 34 be irradiated. It is also possible to arrange the laser light heating device 54 on both sides of the submount bar 34 with respect to the longitudinal direction L to simultaneously irradiate the lateral faces on the both sides of the submount bar 34 with the laser light.

The load application device 53 has a pressing member 56, which is referred to as a nozzle or a collet. The pressing member 56 can apply a pressing load of from several grams to several tens of grams to an upper surface 32p of the laser diode 32 in a direction perpendicular to a mounting surface 34a of the submount bar 34 to press the laser diode 32 against the solder member 42. The load application device 53 also is movable in the longitudinal direction L of the submount bar 34 and can press each of the laser diodes 32 placed on the submount bar 34.

Figure 4:
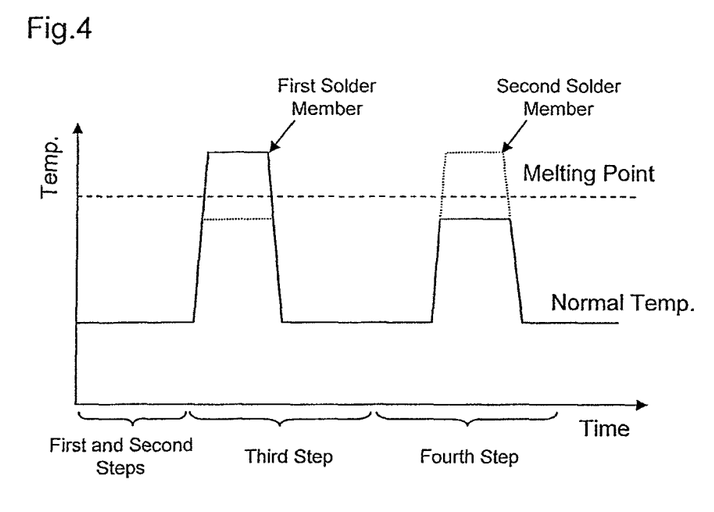
FIG. 4 is a conceptual view illustrating temperature variation of a solder member.

Next, steps of mounting the laser diode 32 on the submount bar 34 are explained. On the mounting surface 34a of the submount bar 34, in order to bond a plurality of the laser diodes 32 to the submount bar 34, a plurality of the solder members 42 are formed in advance. These solder members 42 respectively correspond to the laser diodes 32 and are arrayed in a row in the longitudinal direction L on the mounting surface 34a of the submount bar 34. Here, for the convenience of explanation, of the plurality of the laser diodes 32 placed on the submount bar 34, mutually adjacent two laser diodes are referred to as the first laser diode 32a and the second laser diode 32b, the solder member 42 corresponding to the first laser diode 32a is referred to as a first solder member 42a, and the solder member 42 corresponding to the second laser diode 32b is referred to as a second solder member 42b. The second solder member 42b is adjacent to the first solder member 42a. FIG. 4 illustrates temperature variations of the first and second solder members 42a and 42b.

(First Step)

Figure 3B:
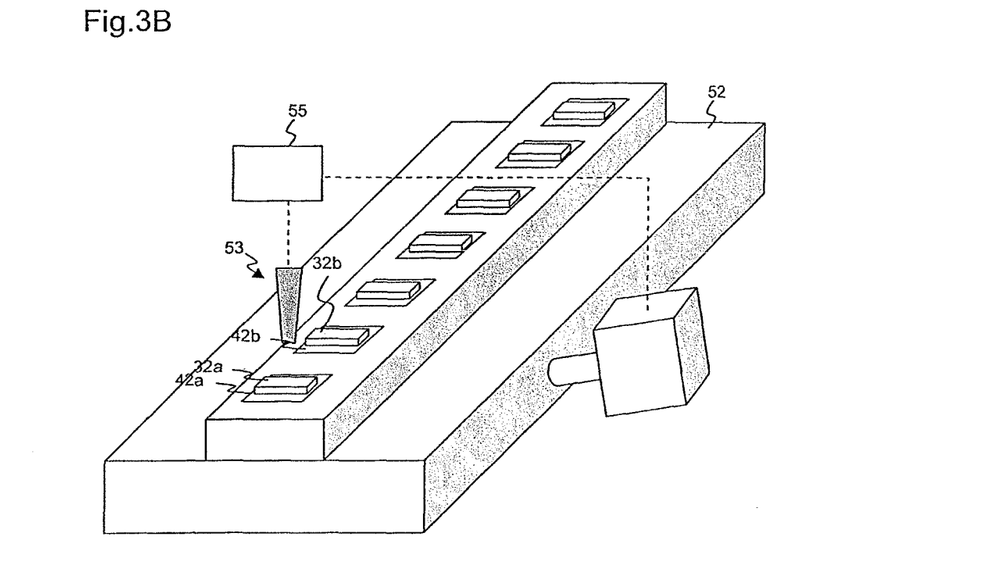

First, as illustrated in FIG. 3B, the submount bar 34 is held on the holding stage 52. In order to hold the submount bar 34, an adhesion layer may be provided between the submount bar 34 and the holding stage 52, or a mechanism may be provided to vacuum-suction the submount bar 34 on the upper surface of the holding stage 52. In this state, a plurality of the laser diodes 32 of the same number as the number of the solder members 42 are placed on the corresponding solder members 42. In the present embodiment, all of the laser diodes 32 are collectively placed on the solder members 42. However, each of the laser diodes 32 may be placed on the respective solder members 42 for bonding one at a time. The holding stage 52 can also be preheated in advance. As illustrated in FIG. 4, the first and second solder members 42a and 42b are at normal temperature (or preheating temperature).

(Second Step)

Figure 3C:
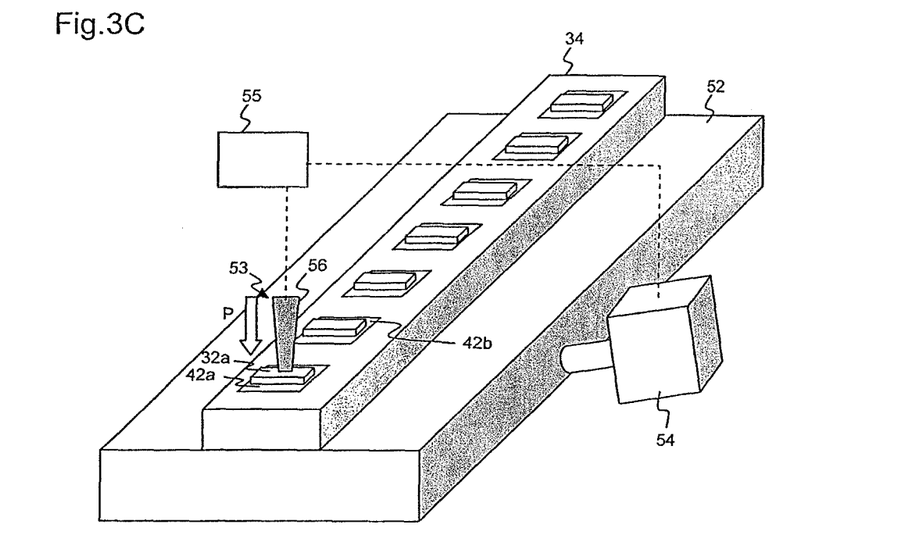
Figure 3D:
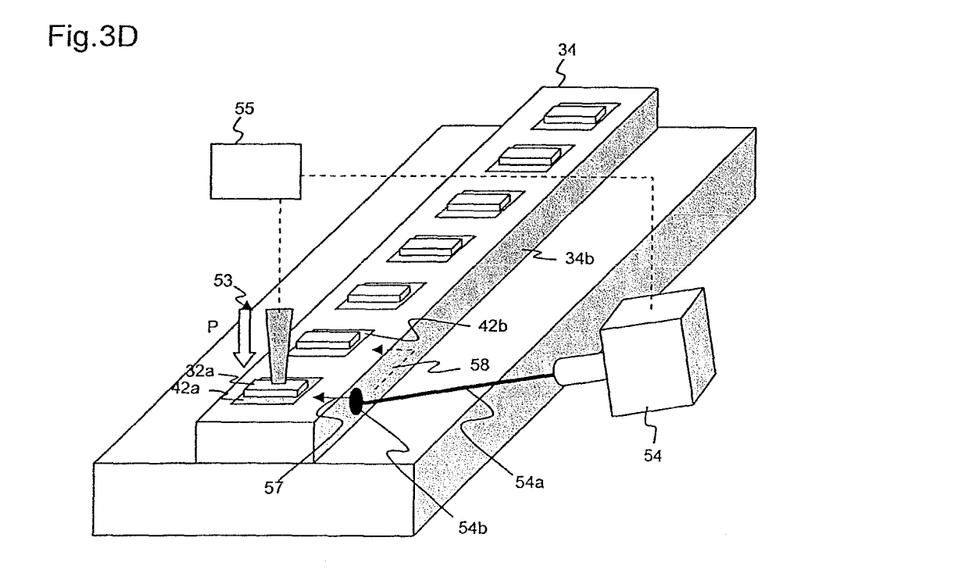

As illustrated in FIG. 3C, the load application device 53 is moved to right above the first laser diode 32a, and is lowered to press the first laser diode 32a with the pressing member 56. By doing so, a pressing load P is applied to the first laser diode 32a, and the first laser diode 32a is pressed against the first solder member 42a.

(Third Step)

As illustrated in FIG. 3C, the heating device 54 is moved to the vicinity of the first laser diode 32a, and, while the pressing load P is being applied, irradiates the lateral face 34b of the submount bar 34 with laser light 54a. It is desirable that an irradiation position 54b of the laser light on the submount bar 34 be about the same as the position of the first solder member 42a with respect to the longitudinal direction L of the submount bar 34.

Figure 3E:
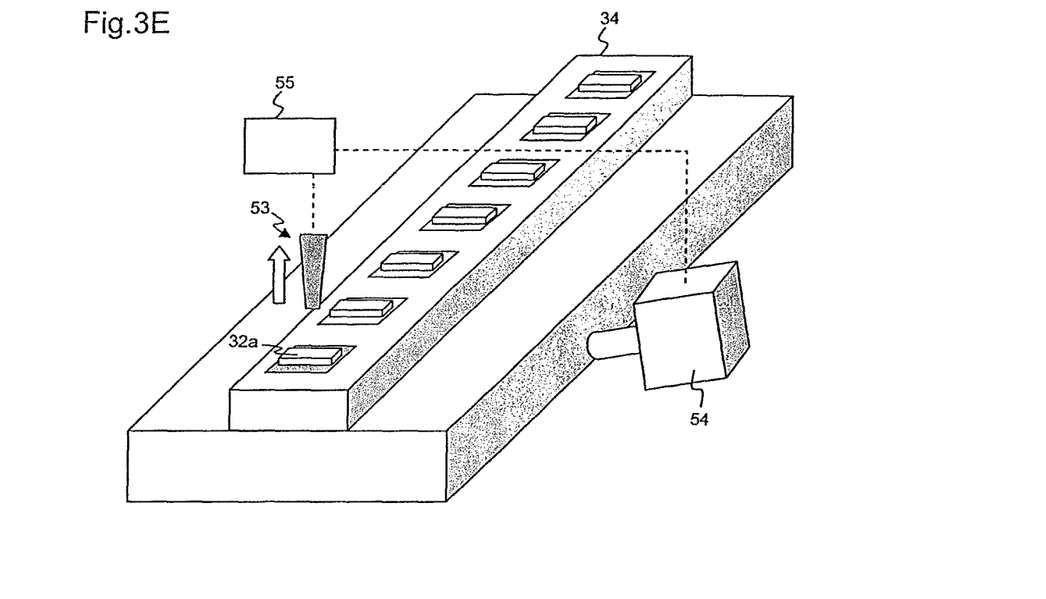

The thermal energy of the laser light irradiated on the lateral face 34b of the submount bar 34 propagates through the interior of the submount bar 34 via thermal conduction 57. As illustrated in FIG. 4, the thermal energy heats the first solder member 42a at a temperature higher than the melting point of the first solder member 42a to melt the first solder member 42a. When the irradiation of the laser light terminates, the first solder member 42a cools and solidifies so that the first laser diode 32a is bonded to the submount bar 34. The thermal energy also propagates, via thermal conduction 58, to the second solder member 42b adjacent to the first solder member 42a. However, since the second solder member 42b is spaced away from the irradiation position 54b, the second solder member 42b does not melt. That is, the second laser diode 32b is not bonded to the submount bar 34 by this irradiation. The first and second solder members 42a and 42b again return to the normal temperature. Thereafter, as illustrated in FIG. 3E, the load application device 53 is raised and the pressing load P is removed.

(Fourth Step)

Figure 3F:
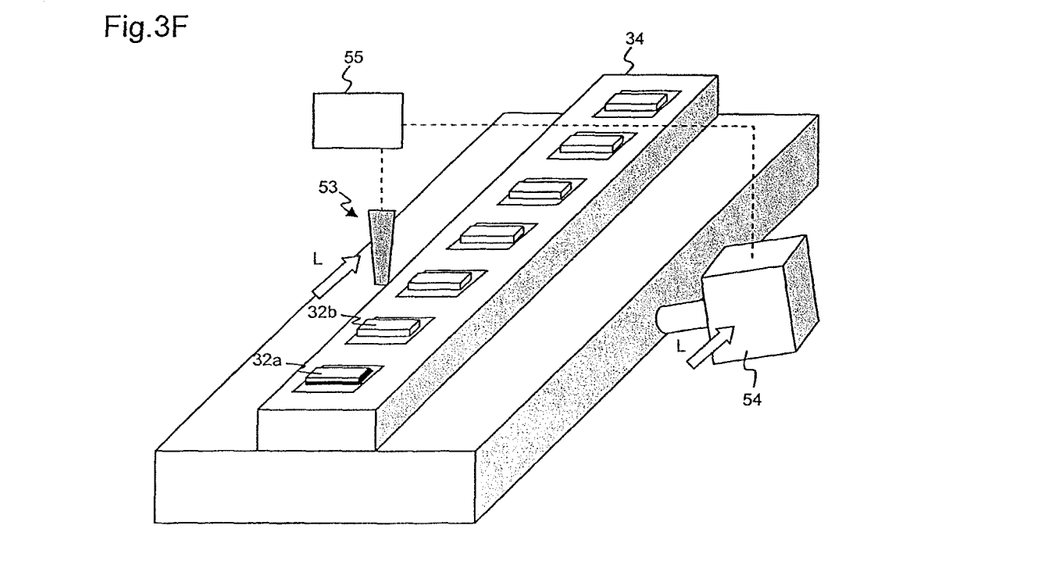
Figure 3G:
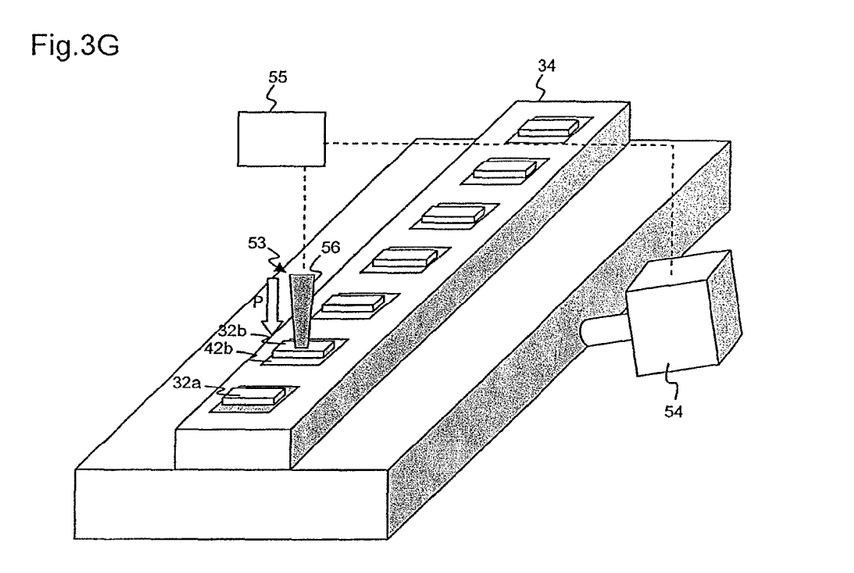

As illustrated in FIG. 3F, the load application device 53 is moved to right above the second laser diode 32b, and, as illustrated in FIG. 3G, is lowered to press the second laser diode 32b with the pressing member 56. By doing so, the pressing load P is applied to the second laser diode 32b and the second laser diode 32b is pressed against the second solder member 42b.

Figure 3H:
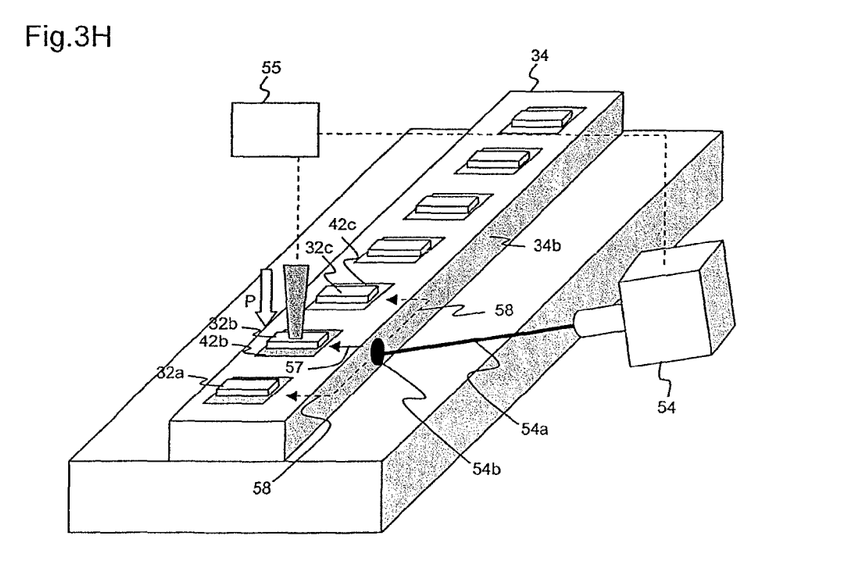

As illustrated in FIG. 3H, the heating device 54 is moved to the vicinity of the second laser diode 32b, and, while the pressing load P is being applied, irradiates the lateral face 34b the submount bar 34 with the laser light 54a. It is desirable that the irradiation position 54b of the laser light on the submount bar 34 be about the same as the position of the second solder member 42h with respect to the longitudinal direction L of the submount bar 34.

The thermal energy of the laser light irradiated on the lateral face 34b of the submount bar 34 propagates through the interior of the submount bar 34 via the thermal conduction 57. As illustrated in FIG. 4, the thermal energy heats the second solder member 42b at a temperature higher than the melting point of the second solder member 42b to melt the second solder member 42b. When the irradiation of the laser light terminates, the second solder member 42b cools and solidifies so that the second laser diode 32b is bonded to the submount bar 34. Thereafter, the pressing load P is removed.

The thermal energy also propagates, via the thermal conduction 58, to the first solder member 42a and a third solder member 42c that are adjacent to the second solder member 42b. However, since the first and third solder members 42a and 42c are spaced away from the irradiation position 54b, the first and third solder members 42a and 42c do not melt. That is, as illustrated in FIG. 4, since the first solder member 42a is not heated to the melting point, there is no significant change to the bonding state of the first laser diode 32a that is already bonded to the submount bar 34 by the first solder member 42a. Also, the third laser diode 32c is not bonded to the submount bar 34.

By irradiating the vicinity of the second solder member 42b with the laser light, the first and third solder members 42a, 42c are softened. The first and third solder members 42a and 42c are not yet in a melt state, so that the first and third solder members 42a and 42c do not liquefy. On the other hand, a residual stress is generated in the first solder member 42a due to the restraint by the pressing force when the first solder member 42a cools and solidifies at the step 3. This residual stress restrains the first laser diode 32a so that there is a possibility that a residual stress is generated also in the first laser diode 32a. By softening, the residual stress that exists in the first solder member 42a is relaxed. Thereafter, the first solder member 42a cools and re-solidifies. As a result, the stress that exists in the first laser diode 32a is also relaxed.

Thereafter, by repeating steps 2 and 3 for each laser diode 32 and solder member 42, all of the laser diodes 32 on the submount bar 34 can be bonded to the submount bar 34. As is clear from the above explanation, a main purpose of the step 4 is to bond the laser diode 32 in the immediate vicinity of the position irradiated by the laser light to the submount bar 34. However, at the same time, in the step 4, the solder member 42 bonding a laser diode 32 adjacent to the laser diode 32 in the immediate vicinity of the laser light irradiation position to the submount bar 34 is heated at a temperature lower than its melting point and is softened so that the residual stress therein is relaxed.

That is, the fourth step is performed as the second and third steps with respect to the second laser diode 32b and the second solder member 42b. However, at the same time, the fourth step is also performed as the step relaxing the residual stress of the first solder member 42a. The reason why such a step is possible to perform is that each solder member 42 is locally heated in the state where the solder member 42 is formed on the submount bar 34, and in this case, adjacent solder members 42 are heated via the thermal conduction in the submount bar 34.

Relaxation of the residual stress in the solder member 42 of the last bonded laser diode 32 cannot be performed using the bonding of other laser diodes 32. Therefore, it is desirable that the solder member 42 of the last bonded laser diode 32 be softened by, for example, lowering the output of the laser to re-irradiate the same position.

The residual stress can also be relaxed by re-melting the solder member 42. For example, a method is possible in which a large number of submounts 33 are placed in a heating furnace or on a heating stage and all of the submounts 33 are collectively heated.

In a case where three submounts A, B, and C are used, first, the laser diode 32 is bonded to the submount A by performing the steps (1)-(4) described in the Background Art. Residual stresses are generated in the solder member 42 of the submount A and the laser diode 32 bonded thereto. Since the submounts B and C are also exposed a high temperature state at the same time, the solder members 42 on the surfaces of the submounts B and C melt. However, since the laser diodes 32 are not placed on the submounts B and C, bonding of the laser diodes 32 is not performed. Next, the laser diode 32 is bonded to the submount B by performing the same steps. At this time, the residual stresses generated in the solder member 42 of the submount A and the laser diode 32 bonded to the submount A are released by the re-melting of the solder member 42. The solder member 42 of the submount C also melts. However, since the laser diode 32 is not placed on the submount C, the laser diode 32 is not bonded to the submount C. Finally, the laser diode 32 is bonded to the submount C by performing the same steps. At this time, the residual stresses generated in the solder member 42 of the submount B and the laser diode 32 bonded to the submount B are released by the re-melting of the solder member 42. The solder member 42 of the submount A also re-melts. However, since the residual stress has already been released, it only repeats re-melting and solidifying. According to such a method, it is possible to release the residual stress without significantly impairing productivity. This method is referred to as a "comparative example 1."

However, this method is not desirable for the following reasons. That is, the position of the laser diode 32 with respect to the submount 33 (or the submount bar 34) needs to be particularly precisely controlled in the case of the thermally-assisted head. Specifically, it is desirable that the light emission surface 32n of the laser diode 32 be aligned with an end surface 33b of the submount 33 facing the magnetic head slider 2 (see FIG. 2). Or, in a case where the light emission surface 32n of the laser diode 32 is positioned at a recessed position in a direction perpendicular to the light emission surface 32n, it is desirable that the distance of the light emission surface 32n from the end surface 33b be equal to or less than 7 µm. That is, it is desirable that a distance d illustrated in FIG. 2 be in a range of 0-7 µm.

In the "comparative example 1", the solder member 42 re-melts and liquefies, Therefore, the laser diode 32 is more likely to move relative to the submount 33, and the position of the laser diode 32 relative to the submount 33 is more likely to deviate from the range described above. In contrast, in the present embodiment, the solder member 42 only softens. Therefore, the laser diode 32 is prevented from making significant movement relative to the submount 33.

An order to bond the laser diodes 32 to the submount bar 34 is not particularly limited. In the present embodiment, the pressing load P is sequentially applied to the plurality of the laser diodes 32 in the order in which the plurality of the laser diodes 32 are arrayed on the submount bar 34. The plurality of the solder members 42 are also sequentially locally heated in the same order. That is, the laser diode 32 at one end of the submount bar 34 is first bonded to the submount bar 34; the laser diodes 32 one by one are bonded to the submount bar 34 in the order in which the laser diodes 32 are arrayed on the submount bar 34; and finally, the laser diode 32 at the other end of the submount bar 34 is bonded to the submount bar 34. However, it is also possible to bond half of the laser diodes 32 at every-other position in the order and then sequentially bond the remaining half of the laser diodes 32. It is also possible to bond the laser diodes 32 in a totally random order. No matter in what order the laser diodes 32 are bonded, when the solder member 42 in the immediate vicinity of the irradiation position 54b of the laser light melts, the solder member 42 adjacent thereto softens. Therefore, all of the solder members 42 can be heated in an order such that melting is followed by softening.

After all of the laser diodes 32 are bonded to the submount bar 34, the submount bar 34 can be cut into individual submounts 33 and a large number of the laser diode units 31 can be obtained. In doing so, it is preferable that characterization assessment and reliability assessment of each of the laser diodes 32 be performed before cutting the submount bar 34. In units of the submount bar 34, a large number of the laser diodes 32 can be efficiently processed. Therefore, effort and cost required for the evaluations can be lowered.

Modified Embodiment

Instead of the submount bar 34, individually heating the submount 33 to melt and soften the solder members 42 is also included within the scope of the present invention. That is, after bonding the laser diodes 32 to the submounts 33 by the steps (1)-(4) described in the Background Art, the residual stress can also be relaxed by, as a step (5), heating the solder members 42 to a temperature below the melting point to soften the solder members 42. The purpose of the present invention to mount the laser diode 32 on the submount 33 with high positional accuracy while relaxing the residual stress can also be achieved by this method. This method requires heating twice in processing a single laser diode 32, and thus has poor production efficiency as compared to the method in which the laser diodes 32 are sequentially bonded to the submount bar 34. However, it is not necessary to strictly control the temperature distribution of the submount bar 34, and thus production management is easy.

Example 1

One thousand laser diode units were prepared and a defective incidence ratio after 2000-hour stress test was obtained. Laser light output during bonding was 60 MW and the temperature of the solder member 42 was 80° C.

In a comparative example, the laser diode units were prepared according to the steps (1)-(4) of the Background Art. Release of the residual stress by softening was not performed. Defectives occurred in four laser diode units (MTTF=500,000 hours).

In an example, the laser diode units were prepared according to the first-fourth steps of the embodiment. At the fourth step, by heating the solder member to a temperature below the melting point to soften the solder member, the residual stresses in the solder member and the laser diode were relaxed. Defectives occurred in two laser diode units (MTTF=1,000,000 hours).

As another example, laser diode units were prepared according to the modified embodiment by performing the step (5) in addition to the steps (1)-(4) of the Background Art. At the step (5), by heating the solder member to a temperature below the melting point to soften the solder member, the residual stresses in the solder member and the laser diode were relaxed. Defectives occurred in two laser diode units (MTTF=1,000,000 hours).

From the above, the effect of the present invention that the residual stresses in the solder member and the laser diode are relaxed by the softening of the solder member was confirmed.

Example 2

One thousand laser diode units were prepared under the same conditions as the example 1. A ratio of the laser diode units whose distance d between the end surface of the submount and the light emission surface of the laser diode is outside the range of 0-7 µm was obtained.

In a comparative example, laser diode units were prepared according to the "comparative example 1" explained in the embodiment. After the bonding of the solder member, re-melting of the solder member occurred by heating the solder member to a temperature the same as that during bonding (a temperature above the melting point), and the residual stress of the solder member was released. Positional displacement exceeding the above described range occurred in seven laser diode units.

In an example, laser diode units were prepared according to the first-fourth steps of the embodiment. The temperature of the solder member at the fourth step was below the melting point. Positional displacement exceeding the above described range occurred in one laser diode unit.

From the above, the effect of the present invention that the laser diode is mounted on the submount with high positional accuracy was confirmed.

A preferred embodiment of the present invention was presented and explained in detail, However, it is to be understood that, without departing from the spirit or scope of the appended claims, various changes and modifications are possible.

What is claimed is:

1. A manufacturing method of a laser diode unit, the laser diode unit having a plurality of submounts that include a first submount and a second submount,
  a plurality of laser diodes that include a first laser diode mounted on the first submount and a second laser diode mounted on the second submount, and
  a plurality of solder members that includes a first solder member corresponding to the first laser diode and a second solder member corresponding to the second laser diode and adjacent to the first solder member,
  the manufacturing method comprising:
  preparing a submount bar in which the plurality of submounts are arrayed in a row and are physically integrated and on which the plurality of solder members are arrayed in a row;
  a first step placing the first laser diode on top of the first solder member formed on a mounting surface of the first submount and placing the second laser diode on top of the second solder member formed on a mounting surface of the second submount;
  a second step applying a first pressing load to the first laser diode and pressing the first laser diode against the first solder member;
  a third step melting the first solder member by a first local laser light heating the first solder member by means of a laser heating device at a temperature higher than a melting point of the first solder member while the first pressing load is being applied, and thereafter, bonding the first laser diode to the first submount by cooling and solidifying the first solder member, and thereafter, removing the first pressing load;
  a fourth step applying a second pressing load to the second laser diode and pressing the second laser diode against the second solder member;
  a fifth step melting the second solder member by a second local laser light heating the second solder member by means of the laser heating device at a temperature higher than a melting point of the second solder member while the second pressing load is being applied, and thereafter, bonding the second laser diode to the second submount by cooling and solidifying the second solder member, and thereafter, removing the second pressing load; and
  a sixth step softening the solidified first solder member by heating the first solder member at a temperature lower than the melting point of the first solder member after the first pressing load has been removed, and thereafter cooling and re-solidifying the first solder member;
  wherein the sixth step is performed by thermal energy that is transmitted from the second solder member to the first solder member via thermal conduction through the submount bar in the fifth step.

2. The manufacturing method according to claim 1, wherein
  pressing loads that include the first and second pressing loads are sequentially applied to the plurality of the laser diodes in an order in which the plurality of the laser diodes are arrayed on the submount bar, and
  the plurality of the solder members are sequentially locally heated in the same order.

3. The manufacturing method of the laser diode unit according to claim 1, wherein
  each laser diode is an edge emitting type, and when each solder member re-solidifies, a light emission surface of each laser diode is aligned with an end surface of each submount, or the light emission surface of each laser diode is positioned recessed at a distance equal to or less than 7 µm from the end surface in a direction perpendicular to the light emission surface.

4. The manufacturing method according to claim 1, wherein
  the second to sixth steps are performed in a state in which each solder member is preheated.

* * * * *